US011013123B2

(12) United States Patent
Tesanovic et al.

(10) Patent No.: US 11,013,123 B2
(45) Date of Patent: May 18, 2021

(54) MOLDED CIRCUIT SUBSTRATES

(71) Applicant: ams Sensors Singapore Pte. Ltd., Singapore (SG)

(72) Inventors: Bojan Tesanovic, Steinhausen (CH); Nicola Spring, Wangen (CH); Simon Gubser, Weesen (CH); Robert Lenart, Zurich (CH); Mario Cesana, Au (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/597,447

(22) Filed: Oct. 9, 2019

(65) Prior Publication Data

US 2020/0045828 A1 Feb. 6, 2020

Related U.S. Application Data

(63) Continuation of application No. 15/766,943, filed as application No. PCT/SG2016/050496 on Oct. 7, 2016, now abandoned.

(Continued)

(51) Int. Cl.
*H05K 3/00* (2006.01)
*H01L 27/146* (2006.01)
(Continued)

(52) U.S. Cl.
CPC ..... *H05K 3/0097* (2013.01); *H01L 27/14618* (2013.01); *H01L 33/486* (2013.01); *H05K 1/0284* (2013.01); *H05K 3/0014* (2013.01); *H01L 33/58* (2013.01); *H01L 33/62* (2013.01); *H01L 2224/48091* (2013.01); *H01L 2224/97* (2013.01); *H01L 2924/181* (2013.01);
(Continued)

(58) Field of Classification Search
None
See application file for complete search history.

(56) References Cited

U.S. PATENT DOCUMENTS 6,946,714 B2   9/2005   Waitl et al.
7,892,412 B2   2/2011   Chang
(Continued)

FOREIGN PATENT DOCUMENTS

DE   102013224581 A   6/2015
EP     1180792 A1   2/2002
TW    201519482 A   5/2015

OTHER PUBLICATIONS

International Search Report for Application No. PCT/SG2016/050496 dated Nov. 8, 2016 (5 pages).
(Continued)

*Primary Examiner* — Alexander G Ghyka
(74) *Attorney, Agent, or Firm* — Michael Best and Friedrich LLP

(57) ABSTRACT

Molded circuit substrates include a conductive layer surrounded by an insulating sidewall. The insulating sidewall further provides a structural component for an electronic module into which the molded circuit substrate is incorporated. Accordingly, the molded circuit substrates can permit better performance, reduce electronic module thickness, and reduce fabrication costs. Methods for fabricating molded circuit substrates can facilitate precise positioning of insulating sidewalls, insulating partitions, electrical contacts and other components.

10 Claims, 5 Drawing Sheets

Related U.S. Application Data

(60) Provisional application No. 62/238,406, filed on Oct. 7, 2015.

(51) Int. Cl.
  *H01L 33/48* (2010.01)
  *H05K 1/02* (2006.01)
  *H01L 33/58* (2010.01)
  *H05K 3/28* (2006.01)
  *H01L 33/62* (2010.01)

(52) U.S. Cl.
  CPC ........ *H01L 2933/0033* (2013.01); *H05K 3/28* (2013.01); *H05K 2201/09118* (2013.01)

(56) References Cited

U.S. PATENT DOCUMENTS

| | | |
|---|---|---|
| 8,735,931 B2 | 5/2014 | Han et al. |
| 2006/0087010 A1 | 4/2006 | Hong |
| 2008/0054288 A1 | 3/2008 | Harrah et al. |
| 2011/0018017 A1 | 1/2011 | Bierhuizen et al. |
| 2011/0037886 A1 | 2/2011 | Singh et al. |
| 2013/0299852 A1 | 11/2013 | Onai et al. |
| 2014/0197446 A1 | 7/2014 | Chen et al. |
| 2014/0291703 A1* | 10/2014 | Rudmann ............... G01S 17/04 257/84 |
| 2015/0034975 A1* | 2/2015 | Rudmann ......... H01L 27/14687 257/82 |
| 2015/0036046 A1 | 2/2015 | Rudmann et al. |
| 2015/0115293 A1* | 4/2015 | Wu ........................ H01L 24/24 257/88 |
| 2015/0372185 A1 | 12/2015 | Rossi |
| 2017/0033271 A1 | 2/2017 | Gruendl et al. |
| 2017/0089757 A1* | 3/2017 | Geiger ..................... G01J 1/06 |
| 2017/0309605 A1* | 10/2017 | Rudmann ......... H01L 27/14634 |
| 2018/0190629 A1* | 7/2018 | Hsu ......................... G01S 17/06 |

OTHER PUBLICATIONS

Supplementary European Search Report for Application No. 16854003.7 dated May 29, 2019 (4 pages).

Office Action issued from the Taiwan Patent Office for related Application No. 105132672 dated Feb. 24, 2020 (9 Pages including English Translation).

* cited by examiner

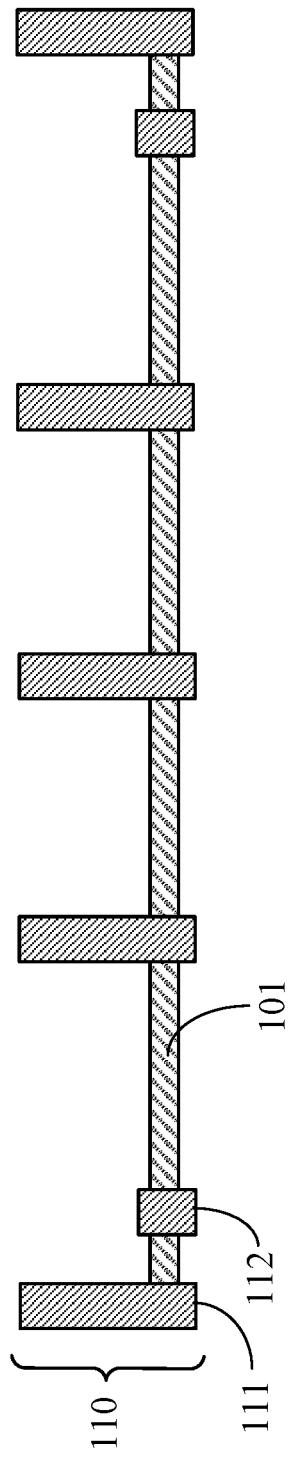
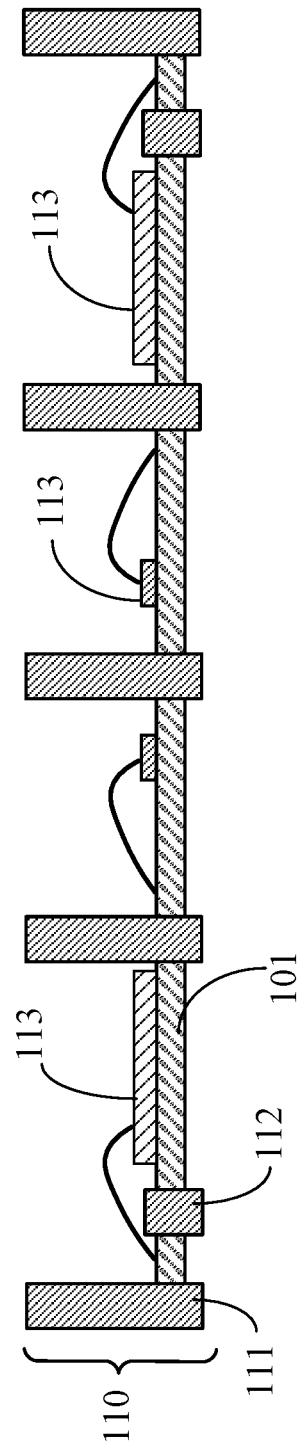
FIG. 1E
FIG. 1F

MOLDED CIRCUIT SUBSTRATES

CROSS REFERENCE TO RELATED APPLICATIONS

This application is a Continuation Application of U.S. patent application Ser. No. 15/766,943, filed Apr. 9, 2018, which is a national stage filing under 35 U.S.C. § 371 of International Patent Application No.: PCT/SG2016/050496, filed Oct. 7, 2016, which claims priority to U.S. Provisional Application No. 62/238,406, filed Oct. 7, 2015, the entire contents of all of which are hereby incorporated by reference herein.

FIELD OF THE DISCLOSURE

This disclosure relates to durable electronic module substrates.

BACKGROUND

Electronic modules are often mechanically mounted on printed circuit boards (PCBs) and in various ways. For example, electronic modules can include sidewalls which then are mounted and fixed to the PCBs via adhesive. PCB's also can provide mechanical support for electronic components within the module, and can connect various electronic components electrically using conductive tracks and pads and other features etched from an electrically conductive sheet (e.g., copper) laminated onto an electrically insulating substrate (e.g., glass-reinforced epoxy). Electrical connections also can be incorporated into PCBs composed of a plurality of planar layers, for example, PCBs with an electrically conductive layer clad on each side by electrically insulating layers. Components or contacts on either side of such an assembly can be electrically connected by vias, plated-through holes. Electronic components (e.g., laser diodes) can generate heat which may accumulate within the electronic module as the electrically insulating layers (e.g., glass-reinforced epoxy) within PCBs are also thermally insulating.

In some instances, the accumulation of heat causes the temperature of the electronic module, or portions of the electronic module, to rise to levels sufficient to damage sensitive components within the module. In some instances, the accumulation of heat causes components within the module to become misaligned (e.g., due to thermal expansion of components within the module). These effects may degrade module performance significantly.

The fabrication of vias, incorporated into PCBs, may pose further problems. Vias are often incorporated into PCBs with at least a single electrically conductive layer cladded on each side by electrically insulating layers. Vias then are fabricated by drilling holes through the insulating layers from opposing sides and into the electrically conductive layer where the holes ideally meet. However, misalignments can occur such that the holes do not meet as intended. Moreover, the drilling process can be an expensive and time-consuming fabrication step. Accordingly, the fabrication of electrical connections without the drilling step could provide reductions in cost and improvements in fabrication efficiencies.

Additional problems can arise when electronic modules are fixed mechanically to PCBs and operated at elevated temperatures. For example, when a PCB is fixed to a component (e.g., via adhesive) the difference in thermal expansion coefficients between the insulating layer and the fixed component can cause significant stresses or points of failure in the electronic module during operation. This can be a particular concern for electronic modules requiring stable dimensions during operation such as optoelectronic modules where lenses are often precisely aligned to electronic components.

PCBs may pose other challenges. For example, often the host devices (e.g., smart phones) into which the electronic modules are incorporated are designed and fabricated to be as thin as possible (i.e., ultra-thin). Consequently, the electronic modules incorporated into these ultra-thin host devices must also be as thin as possible. PCBs, however can contribute significantly to the overall thickness of such electronic modules, thereby limiting their compatibility with ultra-thin host devices. Although in some instances PCBs may be fabricated with ultra-thin dimensions, they also may be excessively brittle or otherwise not durable making handling during fabrication difficult. Further, attempts to avoid the use of ultra-thin PCBs by thinning PCBs of more typical thicknesses in situ are not successful due to the presence of vias. The vias can aggravate machining efforts, thereby limiting the extent to which the thickness of the PCBs can be customized.

SUMMARY

The present disclosure describes molded circuit substrates that, in some implementations, overcome the aforementioned problems and limitations of PCBs. For example, in one aspect a molded circuit substrate includes an insulating sidewall and a conductive layer, the conductive layer is surrounded by the insulating sidewall, and the insulating sidewall defines an electrically isolated region of the conductive layer. The insulating sidewall further defines a structural component within an electronic module. In such implementations the insulating sidewall has the dual function of delineating an electrically isolated region of the conductive layer and delineating a structural component within the electronic module. In some instances, thermal stresses can be reduced. In some instances, the molded circuit substrate can be fabricated to be ultra-thin. In some instances, the electronic module into which the molded circuit substrate is incorporated can be fabricated to be ultra-thin. In instances where active components are electrically connected to the regions of the conductive layer, misalignments during fabrication, such as the misalignments that might occur during fabrication of vias, can be avoided.

In another aspect, the structural component of the insulating sidewalls defines non-transparent sidewalls in an optoelectronic module into which the molded circuit substrate is incorporated. In such implementations, the insulating sidewalls can be advantageous, for example, by providing electrically isolated regions of the conductive layer (that is, they surround the conductive layer) and further providing the structural component of the non-transparent sidewalls, accordingly, permitting superior control of stray light into and/or out of the optoelectronic module.

Some implementations include one or more of the following features. For example, the structural component can define lateral dimensions of a transparent overmold. In some instances, the transparent overmold includes an optical element. In some cases, the transparent overmold includes an optical filter. In such implementations the overmold and the molded circuit substrate can provide an advantage, for example, since in many instance the conductive layer can further include an active (heat generating component). In such instances, the overmold may prevent the adequate dissipation of heat generated from the active component;

accordingly, in such instances, the conductive layer can be advantageous by facilitating the dissipation of heat form the optoelectronic module.

In some implementations, the molded circuit substrate further includes an active optoelectronic component mounted on a surface of the conductive layer. In some instances, the active optoelectronic component includes at least one of the following: a laser diode, an light-emitting diode, a photodiode, an array of laser diodes, an array of light-emitting diodes, and/or an array of photodiodes.

In some implementations, the molded circuit substrate further includes an optical element, and the structural component further defines a substrate on which the optical element is mounted. In some cases, the structural component further defines a separation between the optical element and the conductive layer. In such implementations the molded circuit substrate can provide an advantage, wherein the structural component of the insulating sidewalls can define a separation between the optical element and the conductive layer; for example, in such instances, as the insulating sidewalls provide electrically isolated regions of the conductive layer and the structural component of providing a separation between the optical element and the conductive layer, the separation can be better controlled and predicted (e.g., with changes in operating temperature of the module into which the molded circuit substrate is incorporated).

In some instances, the molded circuit substrate further includes an insulating partition. The insulating partition can define an electrically isolated region of the conductive layer.

In yet another aspect, a method for manufacturing a plurality of molded circuit substrates is described. The method includes: mounting a conductive layer to an etch-resistant substrate; applying a photoresist to the conductive layer; selectively curing the photoresist on the conductive layer to form a pattern delineating the lateral dimensions of a plurality of insulating sidewalls; removing the photoresist from the conductive layer such that the removed photoresist defines the lateral dimensions of the insulating sidewalls; etching the conductive layer; stripping the cured photoresist from the conductive layer; mounting a sidewall tool to the conductive layer, the sidewall tool including cavities delineating a plurality of insulating sidewalls; filling the cavities delineating the plurality of insulating sidewalls with non-transparent moldable material; curing the non-transparent moldable material; removing the sidewall tool from the conductive layer and the cured non-transparent moldable material, the cured moldable material being the plurality of insulating sidewalls; plating the conductive layer; and mounting a plurality of active components to the conductive layer. In such implementations the method for manufacturing the molded circuit substrate can be advantageous. For example, the dimensions (e.g., the thickness) of the molded circuit substrate can be further customized by grinding a surface of the conductive layer following curing of the insulating sidewalls. In some instances, the cured insulating sidewalls provide sufficient mechanical stability to permit grinding a surface of the conductive layer.

In some implementations, a method for manufacturing a plurality of molded circuit substrates further includes: mounting an overmold tool to the plurality of insulating sidewalls, wherein the overmold tool including cavities delineating a plurality of overmolds; filling the cavities delineating the plurality of overmolds with transparent moldable material; curing the transparent moldable material; and removing the overmold tool from the cured non-transparent and transparent moldable material. In some instances, the method for manufacturing a plurality of molded circuit substrate further includes dicing through the insulating sidewalls.

In yet another aspect, a method for manufacturing a plurality of molded circuit substrates includes: mounting a conductive layer to an etch-resistant substrate; applying a photoresist to the conductive layer; selectively curing the photoresist on the conductive layer to form a pattern delineating the lateral dimensions of a plurality of insulating sidewalls; removing the photoresist from the conductive layer such that the removed photoresist defines the lateral dimensions of the insulating sidewalls; etching the conductive layer; stripping the cured photoresist from the conductive layer; mounting a flat tool to the conductive layer, the flat tool being substantially flat and delineating a plurality of insulating partition cavities; filling the insulating partition cavities with non-transparent moldable material; curing the non-transparent moldable material; removing the flat tool from the conductive layer and the cured non-transparent moldable material, the cured moldable material being the plurality of insulating partition cavities; mounting a sidewall tool to the conductive layer, the sidewall tool including cavities delineating a plurality of insulating sidewalls; filling the cavities delineating the plurality of insulating sidewalls with non-transparent moldable material; curing the non-transparent moldable material; removing the sidewall tool from the conductive layer and the cured non-transparent moldable material, the cured moldable material being the plurality of insulating sidewalls; plating the conductive layer; and mounting a plurality of active components to the conductive layer.

Other aspects, features and advantages will be readily apparent from the following detailed description, the accompanying drawings, and the claims.

BRIEF DESCRIPTION OF THE DRAWINGS

FIG. 1A-FIG. 1H depict example steps for manufacturing a plurality of molded circuit substrates.

DETAILED DESCRIPTION

Figure 1A:
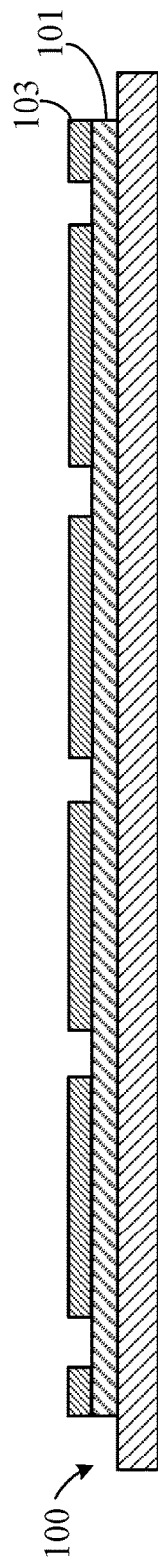
Figure 1B:
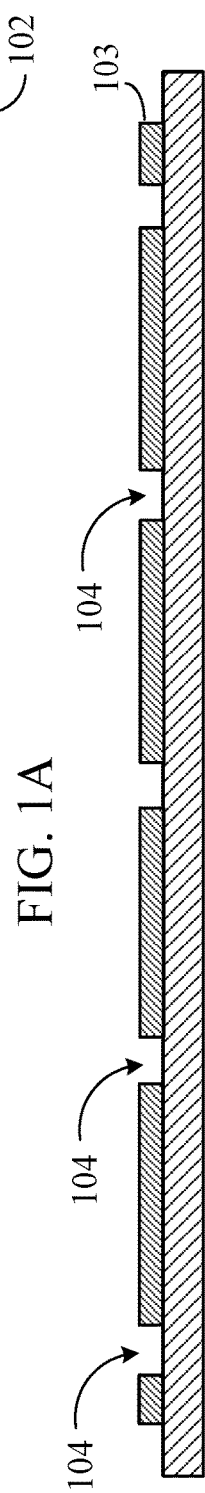

FIG. 1A-FIG. 1H depict example steps for manufacturing a plurality of molded circuit substrates and example optoelectronic modules into which the molded circuit substrates can be incorporated. FIG. 1A depicts an assembly 100 including a conductive layer 101 such as a layer composed of copper, nickel, aluminum or any other electrically and thermally conductive metal or alloy. The conductive layer 101 can be a few microns thick in some instances, in other instances, the conductive layer can up to 50 μm thick, while still in other instances the conductive layer can be up to 100 μm thick. The conductive layer 101 can be mounted to an etch resistance substrate 102 for mechanical support. For example, the etch-resistant substrate 102 can be an acid-resistant adhesive tape, wherein the adhesion properties of such a tape can be customized with, for example, exposure to ultraviolet radiation. FIG. 1A further depicts a photoresist 103 mounted on a surface of the conductive layer 101. In some implementations, the photoresist can be selectively cured, where the uncured photoresist is removed (the state of the photoresist 103 depicted in FIG. 1A). In other implementations, an alternative to a photoresist can be used, for example, another material could be selectively deposited onto a surface of the conductive layer 101. Photoresists (i.e., photo-lithography generally) can be patterned with smaller tolerances (e.g., only a few microns); consequently, photo-lithography can be suited for some implementations that require small tolerances, such as molded circuit substrates integral to high-performance optoelectronic modules. The assembly depicted in FIG. 1A is exposed to an etch solution such as an acid. The etch solution selectively removes portions of the conductive layer as depicted in FIG. 1B.

FIG. 1B depicts the conductive layer 101 with removed portions 104 mounted on the etch-resistant substrate 102 after the assembly 100 in FIG. 1A is subjected to the etch solution. Portions of the conductive layer 104 are removed by the etch solution subsequently delineating electrically isolated regions of the conductive layer 103.

Figure 1C:
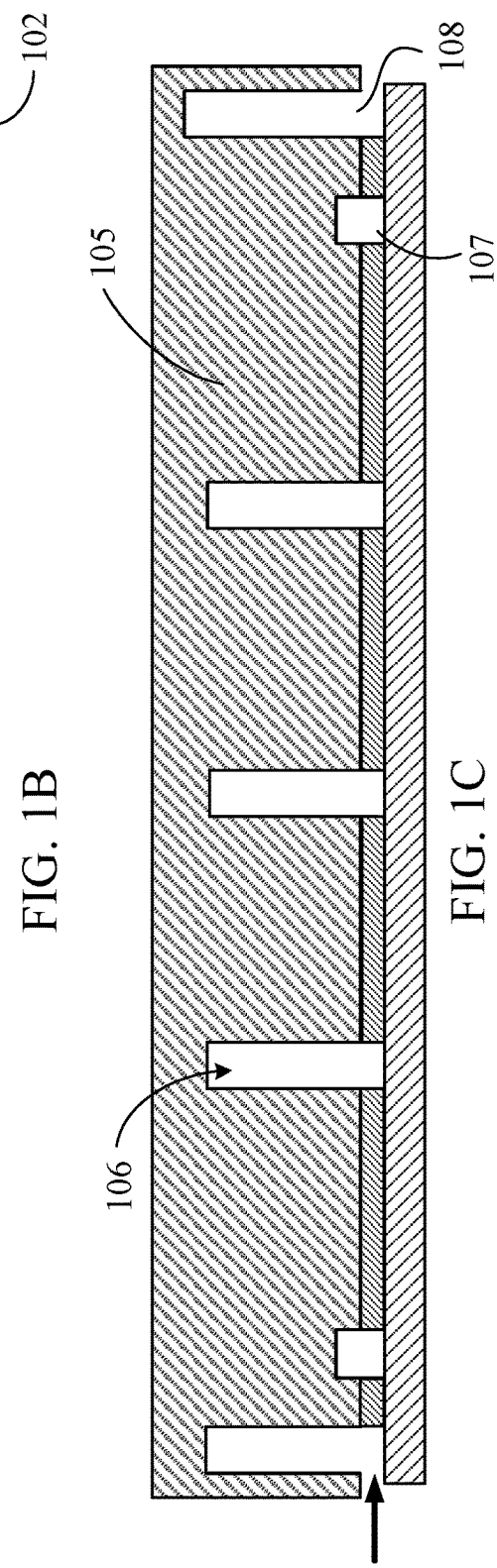

FIG. 1C depicts a sidewall tool 105 in contact with the conductive layer 102. The sidewall tool 105 can be composed of a resilient material such as polydimethylsiloxane (PDMS). The sidewall tool 105 includes cavities 106 delineating insulating sidewalls. The sidewall tool 105 further includes cavities 107 delineating insulating partitions in some implementations. The sidewall tool 105 further includes conduits 108 for the conductance of moldable material such as liquid (curable) polymers and/or epoxy resins (as indicated by the arrow in FIG. 1C). In some implementations, the moldable material can be non-transparent, for example epoxy resins containing inorganic or organic filler such as carbon black.

Figure 1D:
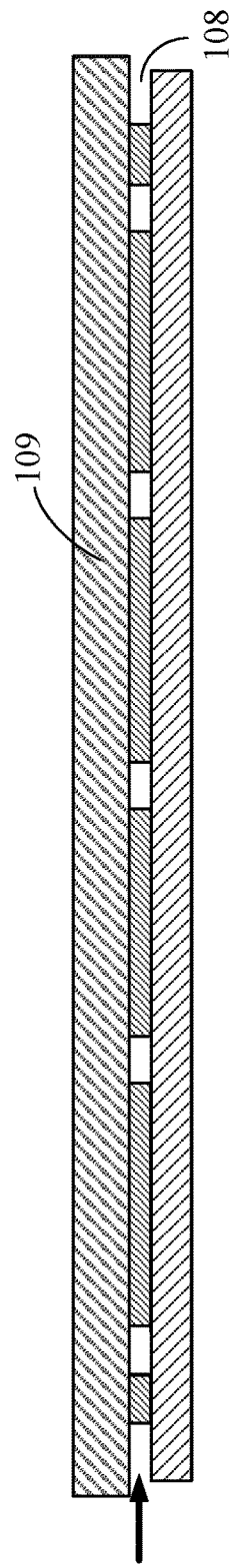

FIG. 1D depicts a flat tool 109 in contact with the conductive layer 101. The flat tool 109 can be composed of a resilient material such as polydimethylsiloxane (PDMS). The flat tool 109 can be substantially flat wherein the removed portions of the conductive layer 104 define cavities, the cavities delineating insulating partitions. In some implementations the flat tool 109 further includes conduits 108 for the conductance of moldable material such as liquid (curable) polymers and/or epoxy resins, while in other implementations the flat tool need not contain further conduits, the removed portions of the conductive layer further delineating conduits for the conductance of moldable material as above. In some implementations, the moldable material can be non-transparent, for example epoxy resins containing inorganic or organic filler such as carbon black.

FIG. 1E depicts a plurality of molded circuit substrates after curing the moldable material described above. The molded circuit substrate can include a plurality of cured insulating sidewalls 111, while in other implementations the molded circuit substrate can include a plurality of cured insulting sidewalls 111 and a plurality of insulating partitions 112 (as depicted in FIG. 1D). Still in some implementations, the molded circuit substrates 110 can include a plurality of insulating partitions 112 (e.g., as a result of employing the flat tool depicted in FIG. 1D). The insulating side-walls 111 can provide an advantage in some implementations, for example; in implementations where the molded circuit substrates 110 are implemented in optoelectronic modules, the insulating sidewalls 111 can provide electrical isolation between regions of the conductive layer 103 while also isolating an active component mounted on isolated region of the conductive layer 103 from stray light.

FIG. 1F depicts the assembly depicted in FIG. 1E with the addition of mounted active components 113 such as laser diodes, light-emitting diodes, photodiodes, arrays of laser diodes, arrays of light-emitting diodes, and/or array of photo-diodes.

Figure 1G:
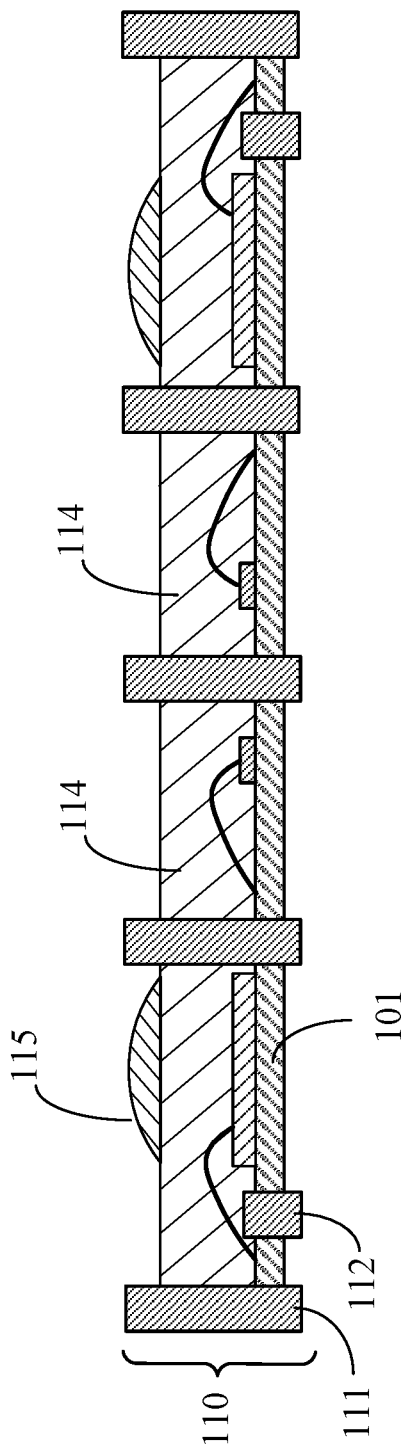

FIG. 1G depicts an assembly including the molded circuit substrate with a plurality of overmolds 114. In some implementations, the plurality of overmolds 114 can further include optical elements 115.

Figure 1H:
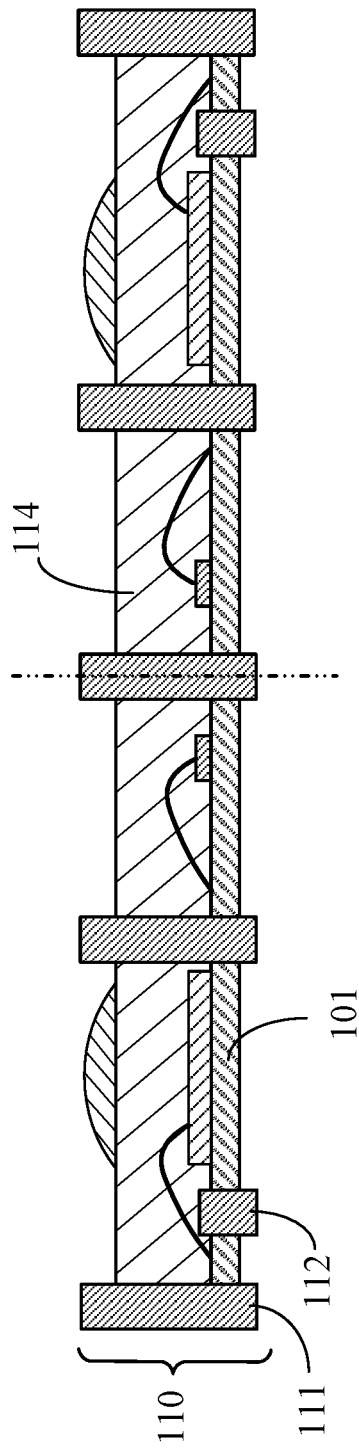

FIG. 1H depicts a plurality of molded circuit substrates incorporated into a plurality of optoelectronic modules, wherein the plurality can be diced (or otherwise separated) thereby forming discrete optoelectronic modules (as indicated by the dotted line).

Figure 2A:
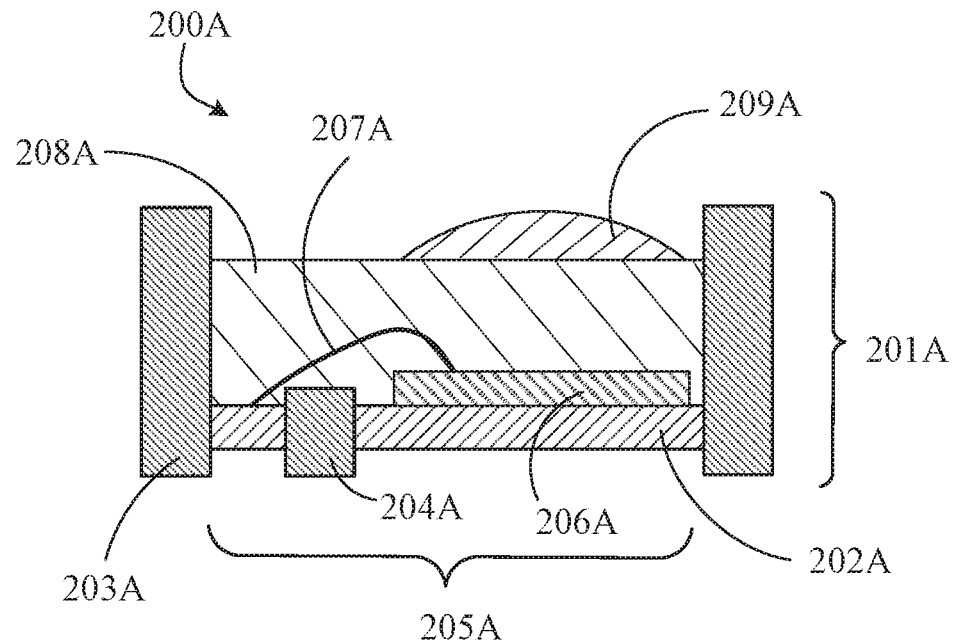
FIG. 2A-FIG. 2B depict example optoelectronic modules into which the molded circuit substrates are incorporated.
Figure 2B:
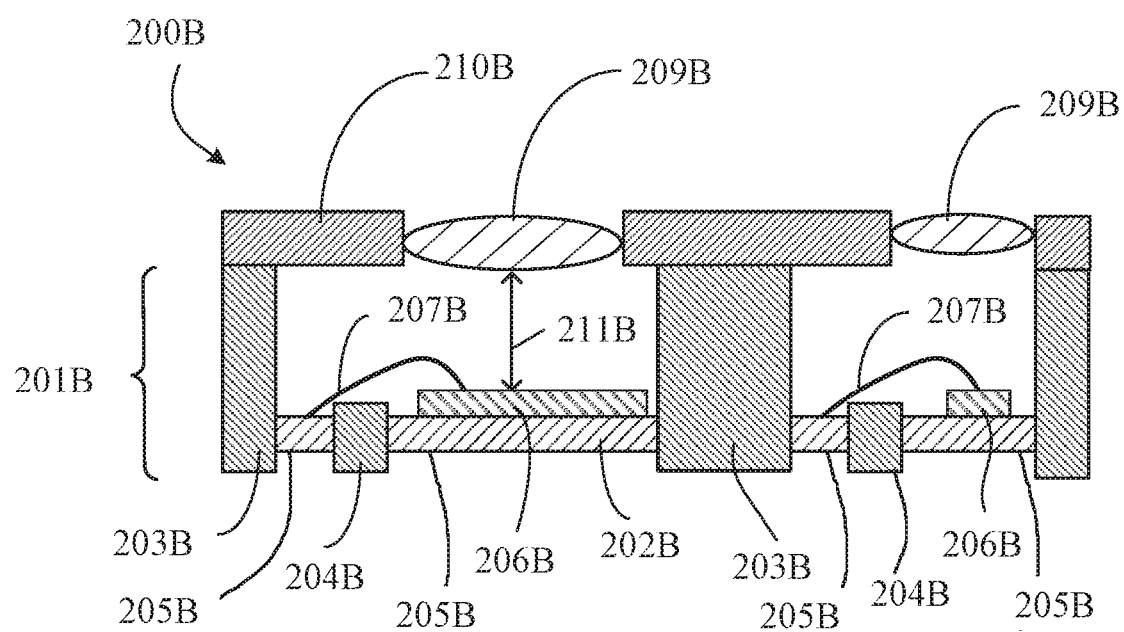

FIG. 2A-FIG. 2B depict example optoelectronic modules into which the molded circuit substrates are incorporated. FIG. 2A depicts an example of a single-channel optoelectronic module 200A. The single-channel optoelectronic module 200A includes a molded circuit substrate 201A. The molded circuit substrate includes a conductive layer 202A surrounded by an insulating sidewall 203A. The conductive layer can be, for example, composed of copper, nickel, aluminum, or other metals or alloys with substantial thermal and electrical conductivity. The molded circuit substrate 201A further includes an insulating partition 204A. The insulating partition 204A provides a plurality of electrically isolated regions 205A of the conductive layer 202A. The singe-channel optoelectronic module 200A further includes an active component 206A electrically connected to the plurality of electrically isolated regions 205A via an electrical connection 207A. The active component 206A can be, for example, a light-emitting diode, a laser diode, a photo-diode, an array of light-emitting diodes, an array of laser diodes (e.g., a vertical-cavity surface-emitting laser array), and/or an array of photodiodes (such as a charge-coupled device array and/or an complementary metal-oxide-semiconductor array). The single-channel optoelectronic module 200A further includes an overmold 208A. The overmold 208A can be composed of substantially transparent material that permits optimal function of the active component 206A such as optical epoxy resins or polymers. The single-channel optoelectronic module can further include an optical element 209A mounted and aligned with the active component 206A. In this implementation, the insulating sidewall 203A can further provide a structural component. For example, the insulating side wall 203A can define the lateral dimensions of the overmold 208. Further, the insulating side wall 203A can be substantially non-transparent to wavelengths of light such as wavelengths to which the active component 206A is sensitive and/or emits. For example, the insulating sidewall 203A can be composed of an epoxy resin, into which substantially non-transparent filler has been incorporated, such as carbon black. In some implementations, the single-channel optoelectronic module can be operable to function as a light emitter (e.g., a light projector a might be used for structured light applications) while in other implementations, the single-channel optoelectronic module can be operable to function as a light-sensitive module (e.g., such as an imager or camera).

FIG. 2B depicts an example of a multi-channel optoelectronic module 200B. The multi-channel optoelectronic module 200B includes a molded circuit substrate 201B. The molded circuit substrate 201B includes conductive layers 202B surrounded by insulating sidewalls 203B. The molded circuit substrate 201B further includes insulating partitions 204B. The insulating partitions 204B provide a plurality of electrically isolated regions 205B of the conductive layers 202B. The multi-channel optoelectronic module 200B further includes active components 206B electrically connected to the plurality of electrically isolated regions 205B via electrical connections 207B. The multi-channel optoelectronic module 200B can further include optical elements 209B mounted in an optical element substrate 210B, the optical elements 209B being mounted and aligned with respective active components 206B. In this implementation, the insulating sidewalls 203B can further provide structural components. For example, the insulating side walls 203B can define a separation 211B between the optical elements and the respective active components 206B. Further, the insulating side walls 203B can be substantially non-transparent to wavelengths of light such as wavelengths to which the active components 206B are sensitive and/or emit. In some implementations, the active component 206B can be, for example, a light-emitting diode, a laser diode, an array of light-emitting diodes, an array of laser diodes a vertical-cavity surface-emitting laser array). In such implementations, an adjacent channel in the multi-channel optoelectronic module can include an active component 206B that can be, for example, a photodiode, and/or an array of photodiodes (such as a charge-coupled device array and/or an complementary metal-oxide-semiconductor array. In some implementations, the multi-channel optoelectronic module can be operable to function as a proximity detector, while in other implementations, the multi-channel optoelectronic module can be operable to function as a 3D imaging camera (such as a time-of-flight camera).

Figure 3:
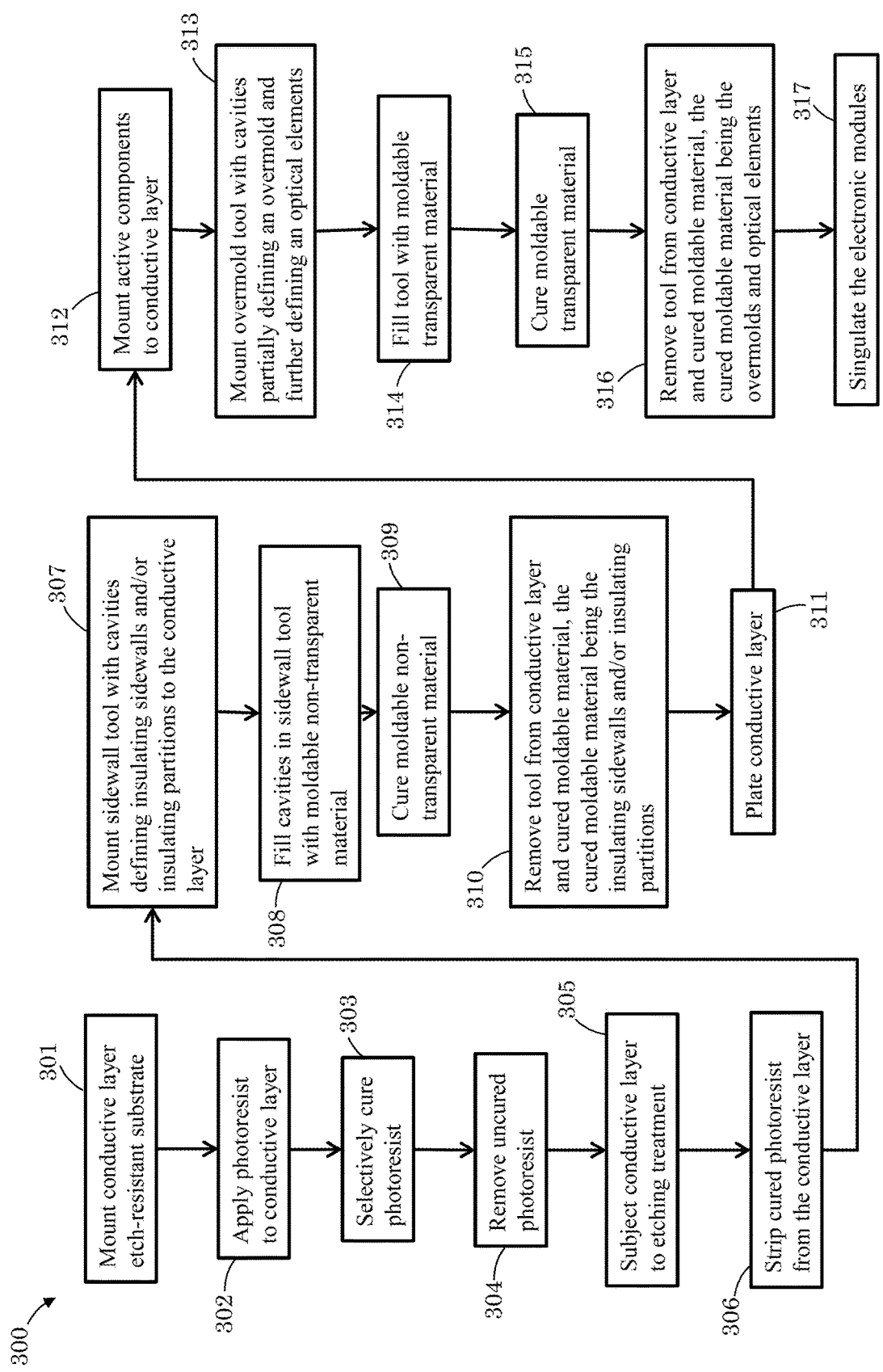
FIG. 3 depicts a flow diagram illustrating example steps for manufacturing a plurality of molded circuit substrates.

FIG. 3 depicts a flow diagram 300 illustrating example steps for manufacturing a plurality of molded circuit substrates. In a step 301 the conductive layer is mounted to an etch-resistant substrate such as adhesive, UV-curable tape. In a subsequent step 302 a photoresist is applied to the conductive layer, for example, via spraying, spin coating or by another method apparent to a person skilled in the art to which this disclosure pertains. In a subsequent step 303 the photoresist is selectively exposed to radiation, such as ultraviolet radiation. For example, in some cases a mask with a pattern can be used to selectively expose the photoresist to the radiation. In a subsequent step 304 the uncured photoresist is removed in a developing step. In a subsequent step 305 the conductive layer is etched with an etching solution, such as a strong acid. In a subsequent step 306 the cured photoresist can be stripped away with, for example, 1-methyl-2-pyrrodidon, dimethyl sulfoxide, an alkaline solution, and/or oxygen plasma. In a subsequent step 307 a sidewall tool is mounted with respect to the conductive layer, wherein the sidewall tool includes cavities delineating insulating sidewalls and/or insulating partitions within the conductive layer. In a subsequent step 308 the cavities in the sidewall tool are filled with moldable material. In some implementations, the moldable material is substantially non-transparent upon curing. In a subsequent step 309 the moldable material is cured e.g., via ultraviolet radiation and/or with heat. In a subsequent step 310 the sidewall tool is removed from the conductive layer and the cured moldable material. The cured moldable material defines the insulating sidewalls and/or the insulating partitions. In a subsequent step 311, the conductive layer is plated e.g., with metals such as gold, palladium, in order to protect the conductive surface from degradation and to improve electrical conductivity. In a subsequent step 312 active components (e.g., photodiodes, laser diodes, light-emitting diodes) are electrically mounted (e.g., soldered) to the conductive layer. In a subsequent step 313 an overmold tool is mounted to the insulating sidewalls, wherein the overmold tool includes cavities partially delineating the dimensions of the overmolds. Further, in some implementations, the overmold tool can contain cavities delineating optical elements. In a subsequent step 314 the cavities in the overmold tool are filled with transparent moldable material. In a subsequent step 315 the moldable material is cured e.g., with ultraviolet light and/or heat. In a subsequent step 316 the overmold tool is removed from the insulating sidewalls. In a subsequent step 317, the insulating sidewalls are diced producing discrete electronic modules in which the molded circuit substrates are incorporated.

The molded circuit substrate and its fabrication described in the above examples can further include, other features not described above. In some implementations, some steps may be omitted and/or other additional steps may be included. Further, although the present invention has been described in detail with respect to various examples, other implementations can include combinations of various disclosed features. Therefore, other implementations are within the scope of the claims.

What is claimed is:

1. An optoelectronic module comprising:
   a conductive layer;
   electrically insulating sidewalls laterally surrounding the conductive layer, and an internal electrically insulating wall extending through the conductive layer, wherein the electrically internal insulating wall separates first and second optical channels of the optoelectronic module from one another;
   a first electrically insulating partition extending through the conductive layer, wherein the first electrically insulating partition separates a first part of the conductive layer into first and second regions electrically isolated from one another;
   a second electrically insulating partition extending through the conductive layer, wherein the second electrically insulating partition separates a second part of the conductive layer into third and fourth regions electrically isolated from one another;
   a light emitter in the first optical channel, the light emitter being mounted on the first region of the conductive layer, the light emitter being connected electrically to the second region of the conductive layer; and
   a light detector in the second optical channel, the light detector being mounted on the third region of the conductive layer, the light detector being connected electrically to the fourth region of the conductive layer;
   wherein the internal electrically insulating wall is non-transparent to a wavelength of light that the light emitted is operable to emit and that the light detector is operable to sense.

2. The optoelectronic module of claim 1, wherein the conductive layer includes a metal.

3. The optoelectronic module of claim 1, wherein the first and second insulating partitions include an epoxy resin.

4. The optoelectronic module of claim 1, wherein the first and second insulating partitions include an epoxy resin containing a filler.

5. The optoelectronic module of claim 1, wherein the first and second insulating partitions include an epoxy resin containing a carbon black filler.

6. The optoelectronic module of claim 1, wherein each of the electrically insulating sidewalls laterally and the internal electrically insulating wall includes an epoxy resin.

7. The optoelectronic module of claim 1, wherein each of the electrically insulating sidewalls laterally and the internal electrically insulating wall includes an epoxy resin containing a filler.

8. The optoelectronic module of claim 1, wherein each of the electrically insulating sidewalls laterally and the internal electrically insulating wall includes an epoxy resin containing a carbon black filler.

9. The optoelectronic module of claim 1, wherein the conductive layer has a thickness of less than approximately µm.

10. The optoelectronic module of claim 1, wherein the electrically insulating sidewalls laterally, the internal electrically insulating wall, and first and second insulating partitions are composed of a cured moldable material.

* * * * *